United States Patent
Cheng et al.

(10) Patent No.: US 8,978,673 B2
(45) Date of Patent: Mar. 17, 2015

(54) MEGASONIC CLEANING SYSTEM

(75) Inventors: Chi Wah Cheng, Hong Kong (HK); Wang Lung Alan Tse, Hong Kong (HK); Leung Por Boris Chan, Hong Kong (HK)

(73) Assignee: ASM Assembly Automation Ltd, Hong Kong (HK)

(*) Notice: Subject to any disclaimer, the term of this patent is extended or adjusted under 35 U.S.C. 154(b) by 1466 days.

(21) Appl. No.: 11/836,458

(22) Filed: Aug. 9, 2007

(65) Prior Publication Data
US 2009/0038638 A1 Feb. 12, 2009

(51) Int. Cl.
*B08B 3/12* (2006.01)
*B08B 3/02* (2006.01)
*H01L 21/67* (2006.01)

(52) U.S. Cl.
CPC ... *B08B 3/12* (2013.01); *B08B 3/02* (2013.01); *H01L 21/67051* (2013.01); *B08B 2203/0288* (2013.01)
USPC ........................................ 134/184

(58) Field of Classification Search
CPC ...... H01L 21/67051; B08B 3/12; B08B 3/02; B08B 2203/0288
USPC .................... 134/15, 172, 181, 902
See application file for complete search history.

(56) References Cited

U.S. PATENT DOCUMENTS

| | | | | |
|---|---|---|---|---|
| 4,826,538 A * | 5/1989 | Sanders et al. | | 134/1 |
| 5,339,842 A | 8/1994 | Bok | | 134/1 |
| 5,383,483 A * | 1/1995 | Shibano | | 134/111 |
| 5,601,655 A * | 2/1997 | Bok et al. | | 134/1 |
| 5,975,098 A * | 11/1999 | Yoshitani et al. | | 134/148 |
| 6,343,609 B1 * | 2/2002 | Kim | | 134/1.3 |
| 6,446,354 B1 | 9/2002 | Na | | 34/236 |
| 2003/0200987 A1 * | 10/2003 | Cheung et al. | | 134/1.3 |

* cited by examiner

*Primary Examiner* — David Cormier
(74) *Attorney, Agent, or Firm* — Ostrolenk Faber LLP

(57) ABSTRACT

A system for cleaning semiconductor packages is provided which includes a pickhead that is configured to hold the semiconductor packages in an array arrangement and a plurality of nozzles, each of which is constructed and arranged to project a separate jet of cleaning fluid upwardly against the semiconductor packages. A megasonic energy generator is coupled for imparting megasonic energy to the cleaning fluid and a driving device drives relative movement between the plurality of nozzles and the pickhead to direct the said jets to clean the array of packages on the pickhead.

17 Claims, 5 Drawing Sheets

MEGASONIC CLEANING SYSTEM

FIELD OF THE INVENTION

The present invention relates to a system for cleaning electronic components, and in particular, to a fluid jet system using megasonic vibrations for dislodging particles on the surfaces of semiconductor devices.

BACKGROUND AND PRIOR ART

Electronic components, such as semiconductor substrates or packaged semiconductor devices, for example Quad Flat No-Lead (QFN) packages and Chip-Scale Ball Grid Array (CSBGA) packages, undergo singulation into separate units after they have been packaged in an array arrangement. After sawing, the molded surfaces of the singulated electronic units are inevitably contaminated with sawing residue, such as saw dust and copper traces.

Typically, singulated electronic packages may be cleaned by mechanical agitation. In one prior art U.S. Pat. No. 6,446,354 entitled "Handler System for Cutting a Semiconductor Package Device", a soft brush is used for creating mechanical agitation on the bottom molded surfaces of the packages. This action assists in removing the sawing residue by loosening the residue. The brush may be wet when wet brushing is required. Next, high pressure water jets are directed to the bottom molded surfaces of the packages to wash off and remove the loosened sawing residue.

There are disadvantages in using a brush for cleaning by mechanical agitation. For example, after a long period of use, some sawing residue is trapped in the brush. Periodic maintenance is therefore necessary to keep the brush clean, or otherwise the dirty brush may introduce dirt onto the surfaces to be cleaned instead. The cleaning effect of mechanical agitation will also be largely reduced with a dirty brush. Additionally, since there is actual contact with the molded surfaces of the packages during brushing, while the brushing force acting on the molded surfaces must be sufficiently large to loosen the sawing residue, the force should not be too large to dislodge the packages being held by vacuum on a pickhead during washing. Otherwise, missing singulated units may result. The problem of missing singulated units is more apparent for smaller packages, for instance QFN packages of dimension 3 mm×3 mm or smaller. Likewise, the pressure from the water jets for washing off the loosened sawing residue should not be too high to avoid dislodging the singulated electronic packages units.

To avoid mechanical agitation, U.S. Pat. No. 5,339,842 entitled "Method and Apparatus for Cleaning Objects" discloses the use of megasonic vibrations to enhance cleaning of electronic packages. Megasonic cleaning uses vibration frequencies of approximately 800 KHz to 1.8 MHz. Therefore, megasonic cleaning can be highly effective for removing particles having a particle size of about 1 micron or less. In this cleaning method, the bottom surface of a workpiece is cleaned by moving the workpiece over a first water tank overflowing with water such that the bottom surface is in contact with the surface of the running water. At the bottom of the water tank, a transducer generates megasonic waves that propagate through the water and upward to the surface of the water where the workpiece is moving through. The moving water and the megasonic waves loosen the sawing residue on the bottom surface of the workpiece, and the water carrying the loosened sawing residue flows into a second water tank surrounding the first water tank.

However, there are shortcomings with this method. Megasonic vibrations are high frequency waves which are highly focused in nature such that only a limited area of the workpiece can be cleaned. Additionally, some dirt or particles released from the surface of the workpiece may not be carried away to the second water tank since the water is flowing at a low speed. The loosened sawing residue may remain in the first water tank and return to adhere to the surface of the workpiece.

Therefore, it would be desirable to achieve a cleaning method for singulated electronic packages which sufficiently cleans the packages without damaging or loosening any singulated units.

SUMMARY OF THE INVENTION

It is thus an object of this invention to seek to provide a method and apparatus for effectively cleaning singulated electronic packages such that no singulated units are damaged or dislodged from a pickhead or other holder during the process.

According to a first aspect of the invention, there is provided an apparatus for cleaning semiconductor packages, comprising: a pickhead that is configured to hold the semiconductor packages in an array arrangement; a plurality of nozzles, each of which is constructed and arranged to project a separate jet of cleaning fluid upwardly against the semiconductor packages; a megasonic energy generator for imparting megasonic energy to the cleaning fluid; and a driving device for driving relative movement between the plurality of nozzles and the pickhead to direct the said jets to clean the array of packages on the pickhead.

According to a second aspect of the invention, there is provided a method for cleaning semiconductor packages, comprising the steps of: providing a pickhead which holds the semiconductor packages in an array arrangement during cleaning; projecting separate jets of cleaning fluid generated from a plurality of nozzles upwardly against the semiconductor packages; imparting megasonic energy to the jets of cleaning fluid with a megasonic energy generator during said projection; and driving relative movement between the plurality of nozzles and the pickhead to direct the said jets to clean the array of semiconductor packages on the pickhead.

It would be convenient hereinafter to describe the invention in greater detail by reference to the accompanying drawings which illustrate preferred embodiments of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiments of the invention when considered with the accompanying drawings, in which.

DETAILED DESCRIPTION OF THE PREFERRED EMBODIMENTS OF THE INVENTION

The preferred embodiments of the present invention will be described hereinafter with reference to the accompanying drawings.

Figure 1:
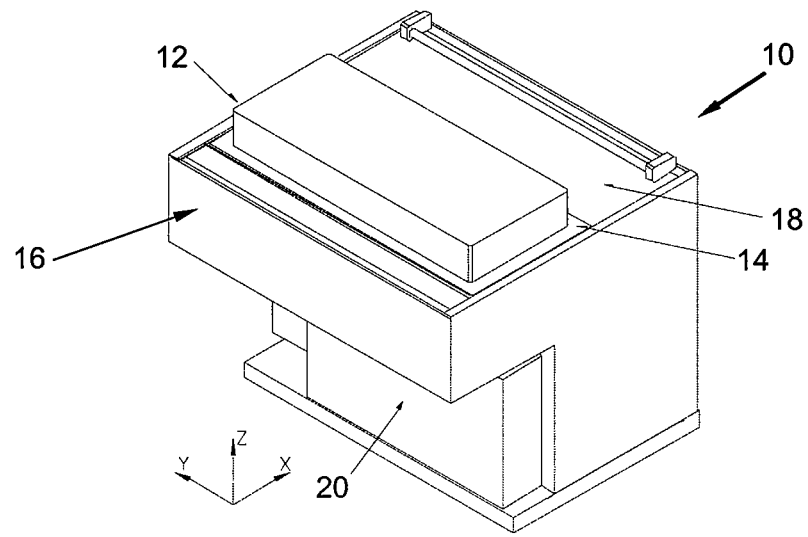
FIG. 1 is an isometric view of a cleaning apparatus according to the preferred embodiment of the invention.

FIG. 1 is an isometric view of a cleaning apparatus 10 according to the preferred embodiment of the invention. The apparatus 10 preferably comprises a cleaning chamber 16. A pickhead 12 and a slider mechanism, which may be in the form of a slider plate 14, are preferably positioned on top of the cleaning chamber 16. The pickhead 12 is configured to hold a plurality of semiconductor packages in an array arrangment and is movable with the slider plate 14. The slider plate 14 is thus operative to move the pickhead 12 along the X-axis. A cover such as a plastic curtain 18 is located adjacent to the slider plate 14 and provides a shield preventing cleaning fluid, which preferably comprises water, from jetting out of the cleaning chamber 16.

A linear driving device 20, which may comprise first and second linear driving devices, drives relative motion between the pickhead 12 and a meganosinc jet assembly 24. For instance, the linear driving device 20 may separately drive the slider plate 14 along the X-axis, and the megasonic jet assembly 24 found within the cleaning chamber 16 along the Y-axis perpendicular to the X-axis.

Figure 2:
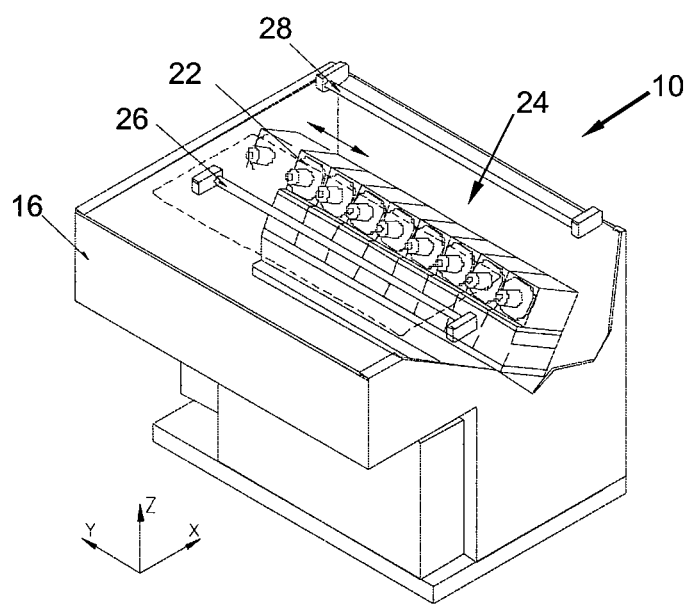
FIG. 2 is an isometric view of the cleaning apparatus of FIG. 1 with its top portion exposed to illustrate the configuration of a row of megasonic jets forming a megasonic jet assembly for generating megasonic waves.

FIG. 2 is an isometric view of the cleaning apparatus of FIG. 1 with its top portion exposed to illustrate the configuration of a single row of nozzles such as megasonic jets 22 forming a megasonic jet assembly 24 for generating megasonic waves. A megasonic energy generator housed in a housing (32, see FIG. 3A) may be installed in a small water reservoir and a tube connected to the reservoir ejects a water jet comprising megasonic vibrations produced by the megasonic generator. High pressure water jets are not required for cleaning using this preferred embodiment of the invention. It is also not necessary to have a large jet of water as the effective working zone of the megasonic vibrations propagating in the jet is relatively small. In the preferred embodiment of the invention, the tube and water jet cross-sectional diameter is about 4 mm to 5 mm. Therefore, in order to clean a larger area of the singulated electronic devices, multiple units of megasonic jets 22 are utilized. To improve coverage, the megasonic jets 22 are inclined at an angle to the horizontal plane on which the pickhead 12 is oriented.

To further ensure that the singulated packages are substantially cleaned, the pickhead 12 holding the singulated electronic devices, preferably by vacuum suction, is movable in the X-axis while the megasonic jets 22 are movable in the Y-axis during use.

The apparatus 10 also has drying devices to speed up drying of singulated electronic devices 30 after cleaning. The drying devices preferably comprise a first dry air tube 26 arranged lengthwise in the cleaning chamber 16, and a second dry air tube 28 arranged lengthwise outside the cleaning chamber 16. The dry air tubes 26, 28 blow air onto the semiconductor packages on the pickhead 12 to dry them.

Figure 3A:
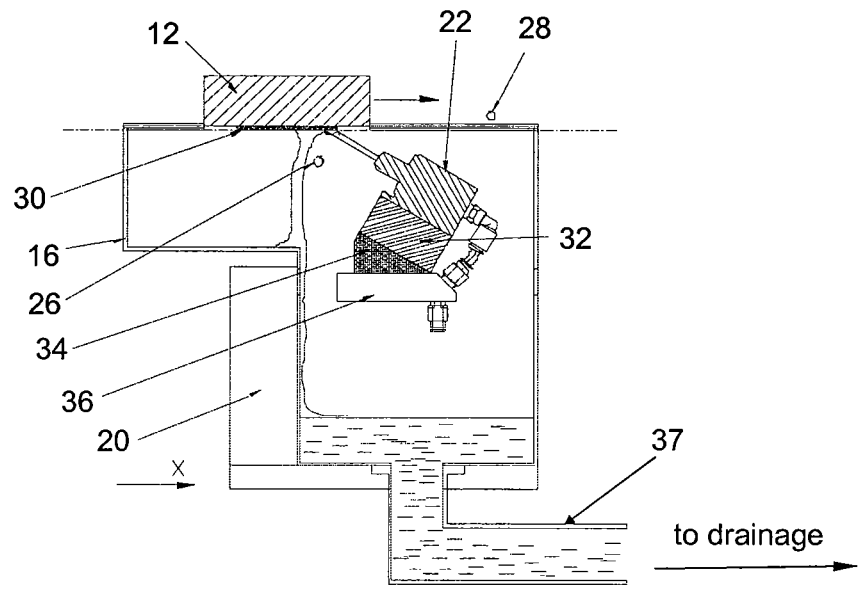
FIGS. 3A to 3D are sectional views of the cleaning apparatus of FIG. 1 illustrating a cleaning and drying sequence for singulated electronic packages according to the preferred embodiment of the invention.

FIGS. 3A to 3D are sectional views of the cleaning apparatus 10 of FIG. 1 illustrating a cleaning and drying sequence for singulated electronic packages 30 according to the preferred embodiment of the invention. FIG. 3A shows the megasonic jet 22 mounted on the housing 32 comprising a control circuit of the megasonic waves generator which is in close proximity to the megasonic jets 22 to reduce signal loss. The housing 32 is mounted on a wedge which may be in the form of an angled alignment block 34 for tilting the megasonic jet assembly 24. This orientation increases the effective cleaning area covered by the water jet. The whole megasonic jet assembly 24 is then mounted on a water supply manifold 36 which supplies water to all the megasonic jets 22.

In FIG. 3A, the pickhead 12 holds a plurality of singulated electronic packages 30. The molded surfaces of the packages 30 face down, while the megasonic jets 22 are pointing upwards. The pickhead 12 moves to the opening of the slider plate 14 and presses against the slider plate 14 to seal any gaps therebetween, which prevents water jets from spraying out of the cleaning chamber 16. The pickhead 12 moves with the slider plate 14 to a position whereat a first column of packages 30 is accessible by the water sprayed from the megasonic jets 22. The megasonic jet assembly 24 moves along the Y direction to clean the molded surfaces of the entire first column of packages 30. Used water carrying the dislodged sawing residue falls to the bottom of the cleaning chamber 16. The bottom of the cleaning chamber 16 has a drainage arrangement 37 for collecting and draining used cleaning water.

Figure 3B:
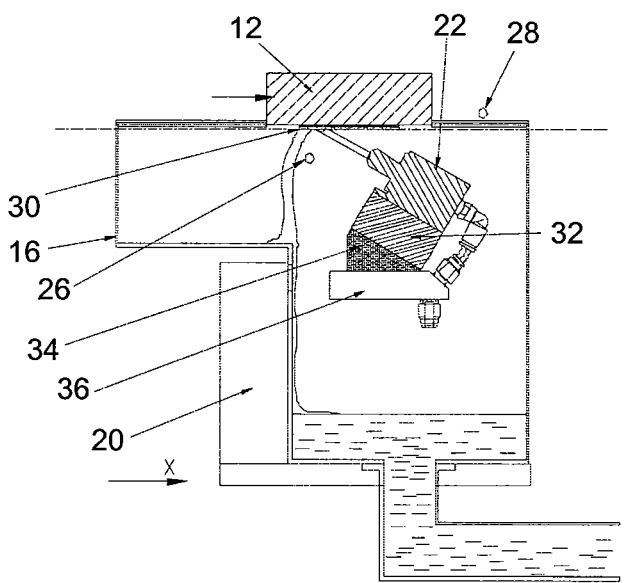

In FIG. 3B, the pickhead 12 moves in the X direction with the slider plate 14 to expose the next column of packages 30 to the megasonic jets 22 for cleaning. The pickhead 12 continues to move in the X direction with the slider plate 14 so that the cycle of cleaning may be repeated until the last column of the packages 30 is cleaned.

Figure 3C:
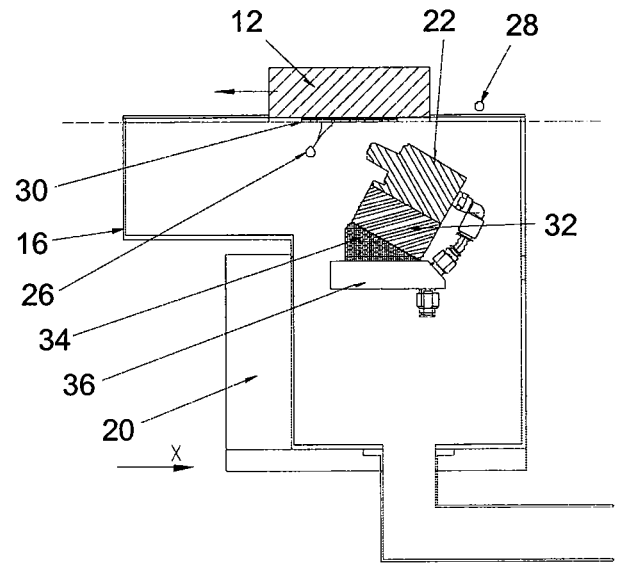

After the last column of the packages 30 has been cleaned, the pickhead 12 moves with the slider plate 14 in a reverse direction along the X-axis, as shown in FIG. 3C. The pre-dry air tube 26 is activated to blow off most of the water on the packages 30 while the pickhead 12 returns to the original position where it was located at the commencement of cleaning. In this way, all the columns of the array of the packages 30 may be dried by blow-drying.

Figure 3D:
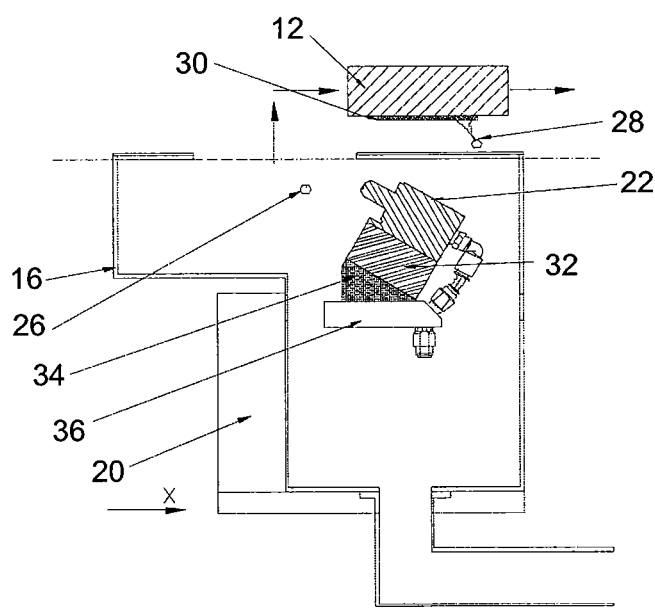

In FIG. 3D, the pickhead 12 is raised to a certain height before moving forward in the X direction. This raised height allows the second dry air tube 28 to blow off any remaining water on the molded surfaces of the packages 30. The clean and dry singulated packages 30 may then be moved to a downstream process. Thereafter, the pickhead 12 picks up another batch of packages and the cycle of cleaning and drying as described above may be repeated.

Figure 4:
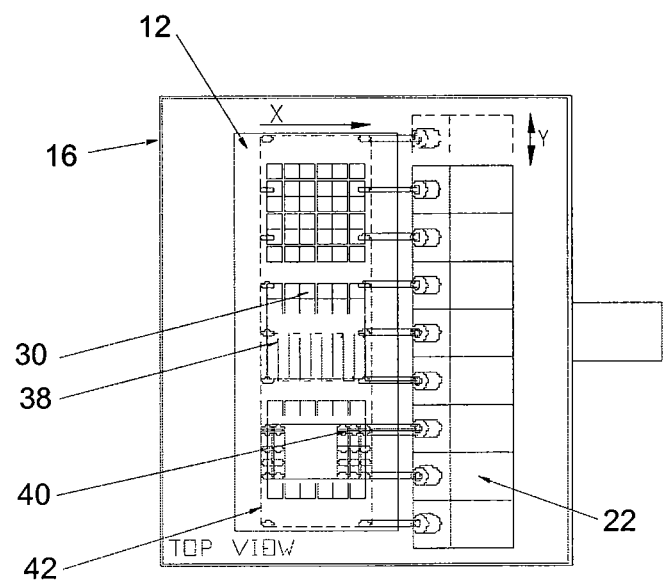
FIG. 4 is a top view of the exposed cleaning apparatus of FIG. 1 illustrating the cleaning coverage of the megasonic jets which are movable in the Y-axis.

FIG. 4 is a top view of the exposed cleaning apparatus 10 of FIG. 1 illustrating the cleaning coverage 42 of the megasonic jets 22 which are movable in the Y-axis. The megasonic jets 22 are located in a row in the megasonic jet assembly 24 and point in generally the same direction. The number of the megasonic jets 22 used depends on the length of the array of packages 30 to be cleaned and the required cycle time. For longer arrays and shorter cycle times, more megasonic jets 22 are preferred. In an exemplary embodiment, six to ten megasonic jets 22 are utilized.

Figure 5A:
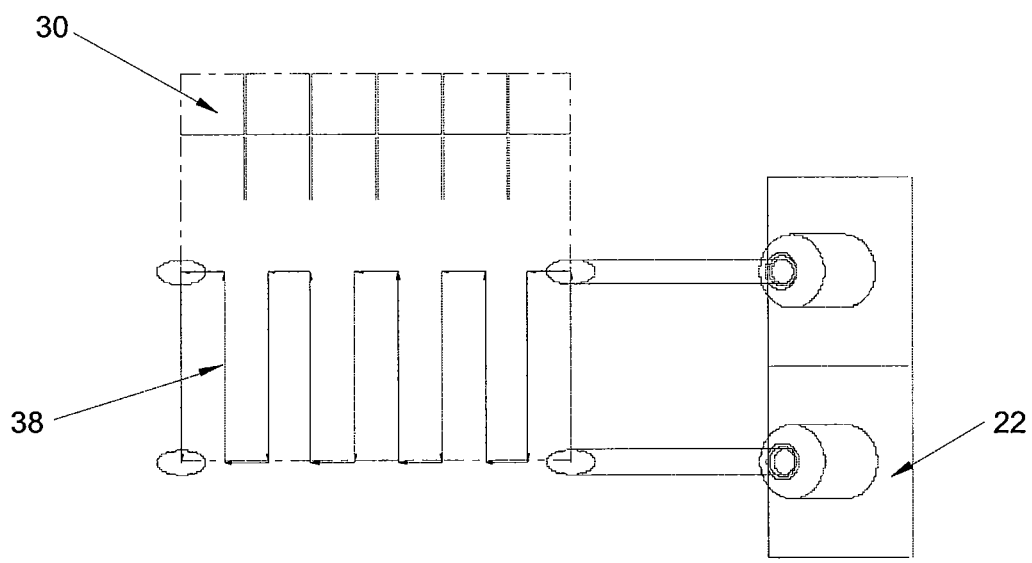
FIGS. 5A and 5B are top views of part of the megasonic jet assemby illustrating a cleaning route of a megasonic jets for a molded block of electronic packages.
Figure 5B:
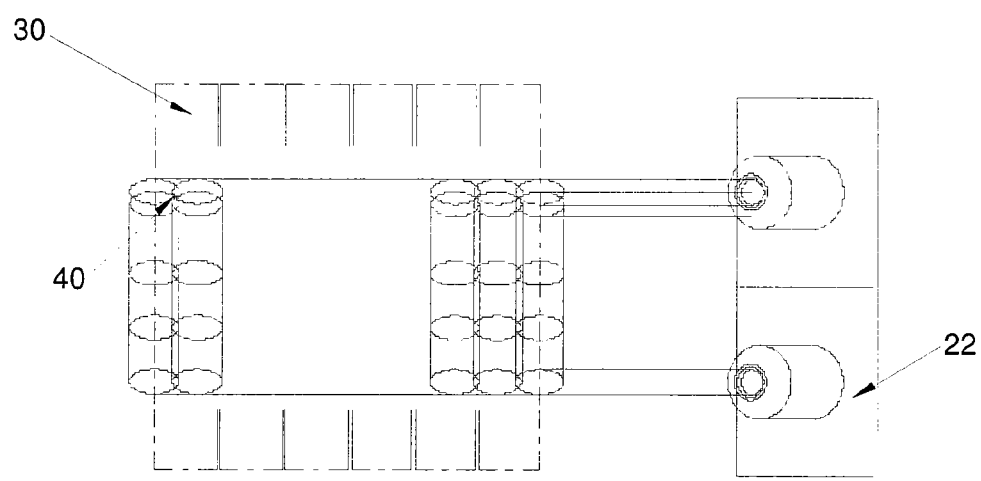

FIGS. 5A and 5B are top views of part of the megasonic jet assemby illustrating a cleaning route 38 of a megasonic jets 22 for a molded block of electronic packages 30. FIG. 5A shows the cleaning route 38 of the a megasonic jets 22 which is cleaning the packages sequentially column by column to cover the cleaning area efficiently. FIG. 5B shows certain areas 40 in the cleaning 38 route that overlap to a cleaning route 38 of an adjacent megasonic jet to ensure that the entire surface of the molded block is cleaned.

Figure 6:
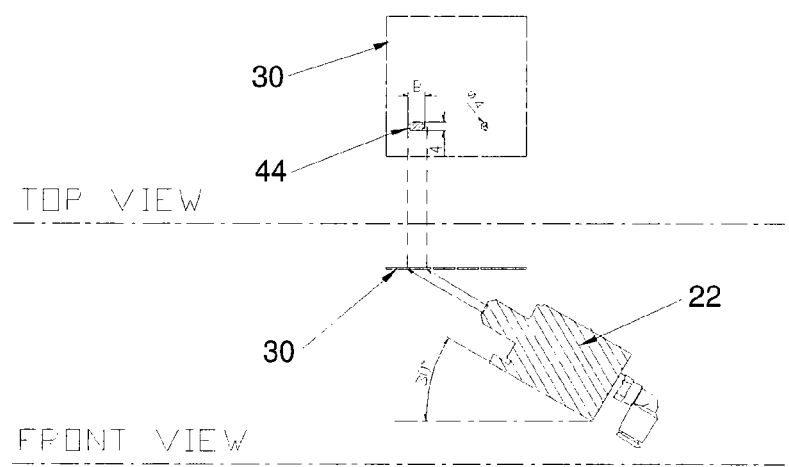
FIG. 6 illustrates top and front views of an elliptical cleaning area offered by a megasonic jet that is inclined relative to a surface to be cleaned.

FIG. 6 illustrates top and front views of an elliptical cleaning area 44 offered by a megasonic jet 22 that is inclined relative to a surface to be cleaned. The cross-sectional diameter of a megasonic jet 22 is about 4 mm to 5 mm, which corresponds with the effective acting zone of the megasonic waves which is also about 4 to 5 mm. To increase the effective cleaning coverage of each megasonic jet 22, the megasonic jets 22 are inclined at an angle from the horizontal plane on which the pickhead 12 holding the semiconductor packages on its surface is oriented so that their projecting areas may be increased. In an exemplary embodiment of this invention, each megasonic jet 22 is inclined substantially at 30 degrees with respect to the cleaned surface to achieve a projection size that is almost double in the X direction. In this way, the routing distance traveled by the megasonic jets 22 and the time required for cleaning are reduced. On the other hand, if the megasonic jets 22 are inclined too much, the cleaning capability of the jets may be decreased.

It should be appreciated that the megasonic vibrations assisted cleaning system 10 in accordance with the preferred embodiment of the invention provides an effective cleaning method for removal of sawing residue from singulated electronic packages 30. After removal, the sawing residue is carried away together with the used water towards the drainage system and is unable to adhere to the singulated packages 30 thereafter. Cleaning time is also shorter than for conventional methods, such as using high pressure water jets with a brush as discussed above. Moreover, less water is consumed as the water jets used in the preferred embodiment of this invention may function with normal pressure and a flow rate of about 0.5 to 1 liter per minute for each megasonic jet 22. As normal pressure may be used, the chance of dislodging units of the singulated electronic packages 30 is reduced as compared to the prior art, reducing the risk of missing singulated units after cleaning.

The invention described herein is susceptible to variations, modifications and/or additions other than those specifically described and it is to be understood that the invention includes all such variations, modifications and/or additions which fall within the spirit and scope of the above description.

The invention claimed is:

1. An apparatus for cleaning semiconductor packages, comprising:
   a chamber having a base;
   a pickhead constructed and configured to hold the semiconductor packages on a surface of the pickhead in an array arrangement over the chamber so that molded surfaces of the packages face downward toward the base of the chamber;
   a plurality of nozzles located in the chamber, each of the nozzles being constructed and arranged to project a separate jet of cleaning fluid upwardly against the semiconductor packages, none of the separate jets overlapping with another separate jet, used cleaning fluid being collected at the base of the chamber;
   a megasonic energy generator configured to impart megasonic energy to the cleaning fluid; and
   a driving device configured to impart a relative two-dimensional movement between the plurality of nozzles and the pickhead so as to direct the separate jets onto every one of the array of packages on the pickhead;
   wherein the driving device comprising a first linear driving device coupled to the pickhead, the first linear driving device being configured to drive the pickhead along one linear axis, and the driving device comprising a second linear driving device, coupled to the plurality of nozzles, configured to drive the nozzles along another linear axis perpendicular to the one linear axis of the pickhead.

2. The apparatus as claimed in claim 1, further comprising a slider mechanism configured to support the pickhead on the chamber, the slider mechanism being further configured to change a position of the pickhead relative to the nozzles.

3. The apparatus as claimed in claim 2, further comprising a cover, adjacent to the slider mechanism, configured to enclose the chamber and to prevent cleaning fluid from jetting out of the chamber.

4. The apparatus as claimed in claim 1, further comprising a drainage arrangement at a base of the chamber, configured to collect and drain used cleaning fluid.

5. The apparatus as claimed in claim 1, wherein the plurality of nozzles are inclined at an angle of 30° to a surface of the pickhead holding the semiconductor packages.

6. The apparatus as claimed in claim 1, wherein the plurality of nozzles is arranged in a single row.

7. The apparatus as claimed in claim 1, wherein each of the nozzles is configured to project the separate jet of cleaning fluid such that a cross-sectional diameter of the jet of cleaning fluid is between 4 mm and 5 mm, which corresponds to the effective zone of the megasonic energy of about 4 to 5 mm.

8. The apparatus as claimed in claim 1, wherein each of the nozzle is configured to project the separate jet of cleaning fluid at a flow rate of 0.5 to 1 liter per minute.

9. The apparatus as claimed in claim 1, wherein the pickhead is oriented horizontally in use.

10. The apparatus as claimed in claim 1, wherein the megasonic energy generator comprises a plurality of megasonic energy generators, each of the megasonic generators being connected to a water source and a respective one of the plurality of nozzles, each of the megasonic energy generators imparting megasonic vibrations to the one of the separate jets of cleaning fluid projected from the respective one of the plurality of nozzles to which the respective megasonic energy generator is connected.

11. The apparatus as claimed in claim 1, wherein the relative two-dimensional movement between the plurality of nozzles and the pickhead includes the plurality of nozzles moving in a first direction and the pickhead moving in a second direction, the second direction being perpendicular to the first direction.

12. An apparatus for cleaning semiconductor packages, comprising:
   a chamber having a base;
   a pickhead constructed and configured to hold the semiconductor packages on a surface of the pickhead in an array arrangement over the chamber so that molded surface of the packages face downward toward the base of the chamber;
   a plurality of nozzles located in the chamber, each of the nozzle being constructed and arranged to project a separate jet of cleaning fluid upwardly against the semiconductor packages, none of the separate jets overlapping with another separate jet, used cleaning fluid being collected at the base of the chamber;
   a megasonic energy generator configured to impart megasonic energy to the cleaning fluid;
   a driving device configured to impart a relative two-dimensional movement between the plurality of nozzles and the pickhead so as to direct the separate jets onto every one of the array of packages on the pickhead; and
   a dry air tube located in the chamber, the dry air tube being configured to blow air onto the semiconductor packages on the pickhead to dry them.

13. The apparatus as claimed in claim 12, further comprising a second dry air tube located outside the chamber, the second dry air tube being configured to blow air onto the semiconductor packages on the pickhead to dry them.

14. An apparatus for cleaning semiconductor packages, comprising:
 a chamber having a base;
 a pickhead constructed and configured to hold the semiconductor packages on a surface of the pickhead in an array arrangement over the chamber;
 a plurality of nozzles located in the chamber, each of the nozzles being configured to project a separate jet of cleaning fluid upwardly against the semiconductor packages, each of the nozzles being further configured to project the separate jet of cleaning fluid at a flow rate of 0.5 to 1 liter per minute, none of the jets overlapping with another separate jet, used cleaning fluid being collected at the base of the chamber;
 a megasonic energy generator configured to impart megasonic energy to the cleaning fluid; and
 a driving device configured to impart a relative movement between the plurality of nozzles and the pickhead to direct the separate jets to clean the array of packages on the pickhead;
 wherein the relative two-dimensional movement between the plurality of nozzles and the pickhead includes the plurality of nozzles moving in a first direction and the pickhead moving in a second direction, the second direction being perpendicular to the first direction.

15. The apparatus as claimed in claim 14, wherein each of the nozzles is configured to project the separate jet of cleaning fluid such that a cross-sectional diameter of the jet of cleaning fluid is between 4 mm and 5 mm, which corresponds to the effective acting zone of the megasonic energy of about 4 to 5 mm.

16. The apparatus as claimed in claim 14, wherein the frequency of the megasonic energy is approximately 800 kHz to 1.8 MHz.

17. The apparatus as claimed in claim 14, wherein the megasonic energy generator comprises a plurality of megasonic energy generators, each of the megasonic generators being connected to a water source and a respective one of the plurality of nozzles, each of the megasonic energy generators imparting megasonic vibrations to the one of the separate jets of cleaning fluid projected from the respective one of the plurality of nozzles to which the respective megasonic energy generator is connected.

* * * * *